United States Patent
Jyousaka et al.

(10) Patent No.: US 7,968,825 B2
(45) Date of Patent: *Jun. 28, 2011

(54) TEMPERATURE SETTING METHOD OF THERMAL PROCESSING PLATE, COMPUTER-READABLE RECORDING MEDIUM RECORDING PROGRAM THEREON, AND TEMPERATURE SETTING APPARATUS FOR THERMAL PROCESSING PLATE

(75) Inventors: Megumi Jyousaka, Koshi (JP); Shinichi Shinozuka, Koshi (JP); Kunie Ogata, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 305 days.

This patent is subject to a terminal disclaimer.

(21) Appl. No.: 11/926,808

(22) Filed: Oct. 29, 2007

(65) Prior Publication Data

US 2008/0105669 A1 May 8, 2008

(30) Foreign Application Priority Data

Nov. 2, 2006 (JP) .................................. 2006-299295

(51) Int. Cl.
*H05B 3/68* (2006.01)
*G03D 5/00* (2006.01)

(52) U.S. Cl. .................. 219/448.12; 219/444.1; 396/611

(58) Field of Classification Search .... 219/443.1–468.2; 118/724, 725; 396/611
See application file for complete search history.

(56) References Cited

U.S. PATENT DOCUMENTS

| | | | | |
|---|---|---|---|---|
| 5,640,237 A | * | 6/1997 | Esrig et al. | 356/237.2 |
| 6,457,882 B2 | | 10/2002 | Ogata et al. | |
| 6,722,798 B2 | | 4/2004 | Senba et al. | |
| 2006/0198633 A1 | * | 9/2006 | Tanaka et al. | 396/611 |
| 2007/0254386 A1 | * | 11/2007 | Asano | 438/14 |
| 2009/0082911 A1 | * | 3/2009 | Jyousaka et al. | 700/300 |

FOREIGN PATENT DOCUMENTS

| | | |
|---|---|---|
| JP | 2001-143850 | 5/2001 |
| JP | 2003-209093 | 7/2003 |
| JP | 2006-128572 | 5/2006 |

* cited by examiner

*Primary Examiner* — Sang Y Paik
(74) *Attorney, Agent, or Firm* — Oblon, Spivak, McClelland, Maier & Neustadt, L.L.P.

(57) ABSTRACT

A thermal plate of a heating unit is divided into a plurality of thermal plate regions, and a temperature can be set for each of the thermal plate regions. A temperature correction value for adjusting a temperature within the thermal plate can be set for each of the thermal plate regions of the thermal plate. The line widths within the substrate which has been subjected to a photolithography process are measured, and an in-plane tendency of the measured line widths is decomposed into a plurality of in-plane tendency components using a Zernike polynomial. From the calculated plurality of in-plane tendency components, in-plane tendency components improvable by changing the temperature correction values are extracted and added together to calculate an improvable in-plane tendency of the measured line widths within the substrate. The change of setting of the temperature correction value for each of the thermal plate regions of the thermal plate is performed only when the magnitude of the improvable in-plane tendency exceeds a threshold value set in advance.

13 Claims, 10 Drawing Sheets

IN-PLANE TENDENCY Z OF
MEASURED LINE WIDTHS

FIG.8

IMPROVABLE IN-PLANE          IMPROVABLE IN-PLANE
TENDENCY COMPONENTS $Za_i$    TENDENCY $Za$

FIG.9

$$M = \begin{pmatrix} M_{11}, & M_{12}, & \cdots & M_{1m} \\ M_{21}, & M_{22}, & \cdots & M_{2m} \\ \vdots & \vdots & \ddots & \vdots \\ M_{n1}, & M_{n2}, & \cdots & M_{nm} \end{pmatrix}$$

$$\begin{pmatrix} \Delta T_1 \\ \Delta T_2 \\ \Delta T_3 \\ \Delta T_4 \\ \Delta T_5 \end{pmatrix} = M^{-1} \begin{pmatrix} 0 \\ -Za_2 \\ -Za_3 \\ \vdots \\ 0 \\ -Za_i \\ 0 \\ \vdots \end{pmatrix} \quad \cdots\cdots (2)$$

TEMPERATURE SETTING METHOD OF THERMAL PROCESSING PLATE, COMPUTER-READABLE RECORDING MEDIUM RECORDING PROGRAM THEREON, AND TEMPERATURE SETTING APPARATUS FOR THERMAL PROCESSING PLATE

BACKGROUND OF THE INVENTION

1. Field of the Invention

The present invention relates to a temperature setting method of a thermal processing plate, a computer-readable recording medium recording a program thereon, and a temperature setting apparatus for a thermal processing plate.

2. Description of the Related Art

In a photolithography process in manufacturing, for example, a semiconductor device, for example, a resist coating treatment of applying a resist solution onto a wafer to form a resist film, exposure processing of exposing the resist film into a predetermined pattern, heating processing of accelerating the chemical reaction in the resist film after exposure (post-exposure baking), and developing treatment of developing the exposed resist film are performed in sequence, so that the series of wafer processing forms a predetermined resist pattern on the wafer.

For example, the heating processing such as the above-described post-exposure baking is usually performed in a heating processing apparatus. The heating processing apparatus includes a thermal plate for mounting and heating the wafer thereon. The thermal plate has a heater embedded therein which generates heat by power feeding, and the heat generated by the heater adjusts the thermal plate to a predetermined temperature.

The thermal processing temperature in the above-described heating processing greatly affects the line width of the resist pattern to be finally formed on the wafer. Hence, to strictly control the temperature within the wafer during heating, the thermal plate of the above-described heating processing apparatus is divided into a plurality of regions, and an independent heater is embedded in each of the regions to adjust the temperature for each of the regions.

It is known that if the temperature adjustment for all of the regions of the above-described thermal plate is performed at the same set temperature, the temperature may vary within the wafer on the thermal plate, for example, due to the difference in thermal resistance between the regions, eventually resulting in variations in the line width of the resist pattern. For this reason, a temperature correction value (a temperature offset value) is set for each of the regions of the thermal plate to finely adjust the in-plane temperature of the thermal plate (Japanese Patent Application Laid-open No. 2001-143850).

Since an optimal temperature correction value for the above-described thermal plate varies depending on the apparatus state and processing environment, the set value needs to be changed as necessary. The change of the setting of the temperature correction value has been usually performed by an operator performing the line width measurement of the resist pattern and making judgment according to his/her experience and knowledge in consideration of data of the line width measurement results. Thereafter, the timing to change the setting of the temperature correction value is influenced by experience, knowledge, and judgment of each operator, causing variations. As a result, different operators might or might not perform change the temperature correction value even for the same line width measure result, which has also caused variations in the set value of the temperature correction value, eventually resulting in variations also in the line widths of the resist pattern.

SUMMARY OF THE INVENTION

The present invention has been developed in consideration of the above points, and its object is to make the timing to change the temperature setting of a thermal processing plate such as a thermal plate stabilized and appropriate.

The present invention to attain the above object is a temperature setting method of a thermal processing plate when mounting and thermally processing a substrate thereon, the thermal processing plate being divided into a plurality of regions, a temperature being settable for each of the regions, and a temperature correction value for adjusting an in-plane temperature being settable for each of the regions, the method including the following steps.

The method includes the steps of measuring processing states within the substrate for the substrate which has been subjected to a series of substrate processing including the thermal processing; calculating, from an in-plane tendency of the substrate of the measured processing states, an in-plane tendency improvable by changing the temperature correction value for each of the regions of the thermal processing plate; and changing the temperature correction value for each of the regions of the thermal processing plate when a magnitude of the improvable in-plane tendency exceeds a threshold value set in advance.

According to the present invention, the improvable in-plane tendency is calculated from the in-plane tendency of the substrate of the measured processing states, and the temperature correction values are changed when the magnitude of the improvable in-plane tendency exceeds the threshold value which has been set in advance, thus making it possible to make the timing to change the settings of the temperature correction values stabilized. Further, since the temperature correction values are changed only when the improvable in-plane tendency is large, the timing to change the settings of the temperature correction values can be made appropriate without changing the temperature correction values in an unnecessary case.

When the magnitude of the improvable in-plane tendency exceeds the threshold value, an alarm may be issued.

In calculating the improvable in-plane tendency, the in-plane tendency of the substrate of the measured processing states may be decomposed to a plurality of in-plane tendency components using a Zernike polynomial, and in-plane tendency components improvable by changing the temperature correction value for each of the regions of the thermal processing plate of the plurality of in-plane tendency components may be added to calculate the improvable in-plane tendency.

In changing the temperature correction value for each of the regions of the thermal processing plate, the temperature correction value for each of the regions of the thermal processing plate to bring each of the improvable in-plane tendency components to 0 (ZERO) may be calculated using a calculation model indicating a correlation between change amounts of the in-plane tendency components and the temperature correction values, and the calculated temperature correction value may be set for the temperature of each of the regions of the thermal processing plate.

The series of substrate processing may be processing of forming a resist pattern on the substrate in a photolithography process. The processing states within the substrate may be line widths of the resist pattern. The thermal processing may be heating processing performed after exposure processing and before developing treatment.

According to the present invention according to another aspect, the above-described temperature setting method of a thermal processing plate may be, for example, computer-programmed and stored in a computer-readable recording medium.

The present invention according to another aspect is a temperature setting apparatus for a thermal processing plate for mounting and thermally processing a substrate thereon, the thermal processing plate being divided into a plurality of regions, a temperature being settable for each of the regions, and a temperature correction value for adjusting an in-plane temperature of the thermal processing plate being settable for each of the regions of the thermal processing plate, and the temperature setting apparatus may include a computing unit for performing the following processes. Specifically, the computing unit is for performing the processes of calculating an in-plane tendency improvable by changing the temperature correction value for each of the regions of the thermal processing plate from an in-plane tendency of the substrate of the processing states based on the processing states within the substrate for the substrate which has been subjected to a series of substrate processing including the thermal processing, and changing the temperature correction value for each of the regions of the thermal processing plate when a magnitude of the improvable in-plane tendency exceeds a threshold value set in advance.

According to the present invention, the timing to change the temperature setting of a thermal processing plate is made appropriate and stabilized, so that the final processing states of the substrate is also made appropriate and stabilized.

DETAILED DESCRIPTION OF THE INVENTION

Figure 1:
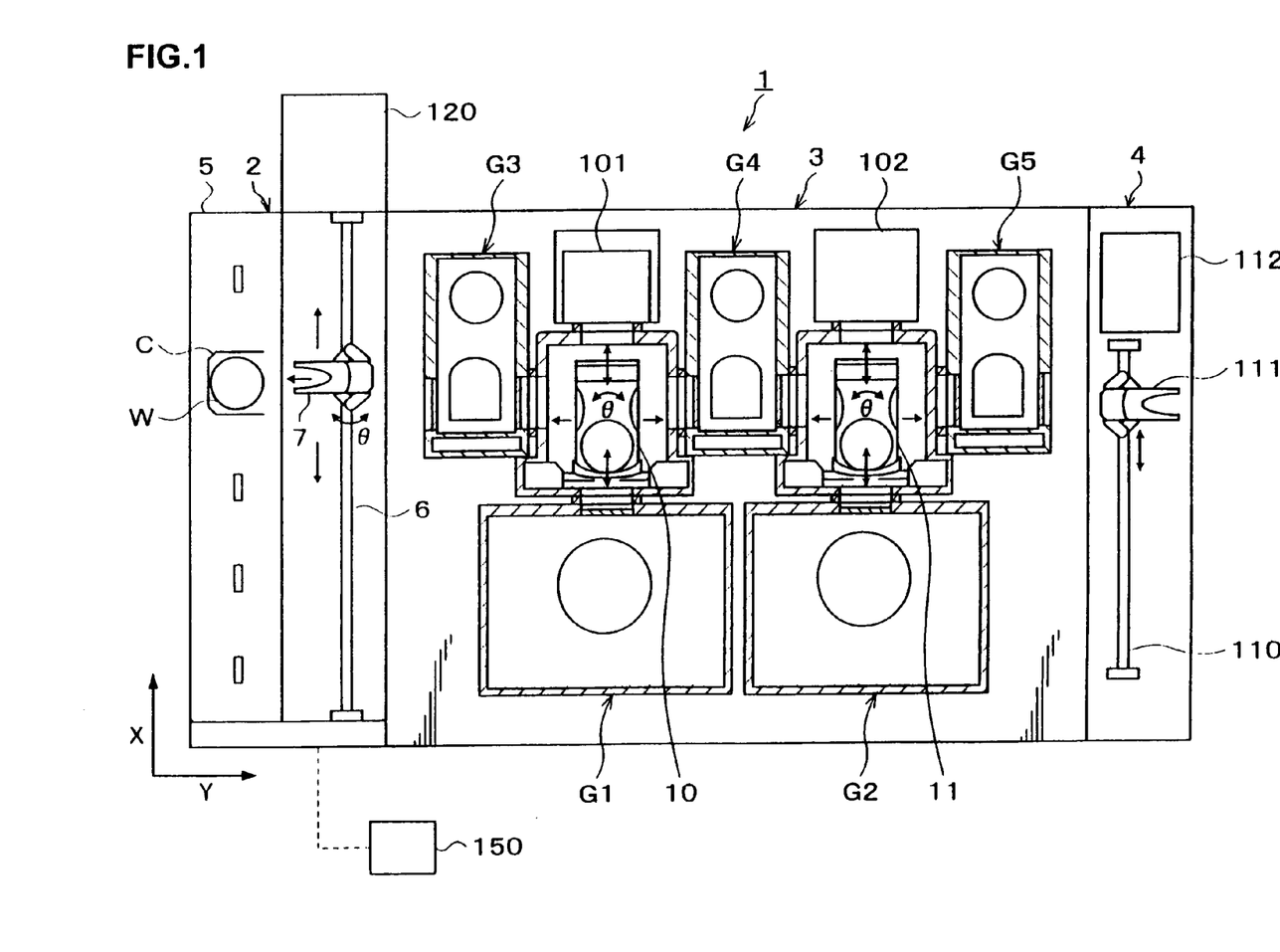
FIG. 1 is a plan view showing the outline of a configuration of a coating and developing treatment system.
Figure 2:
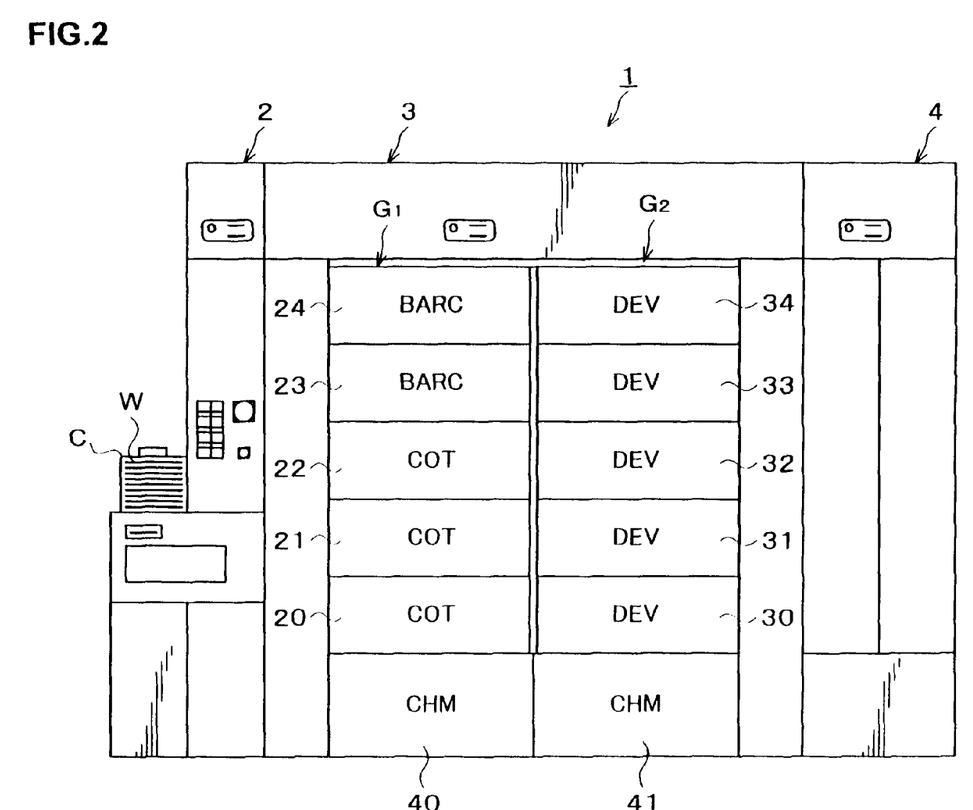
FIG. 2 is a front view of the coating and developing treatment system in FIG. 1.
Figure 3:
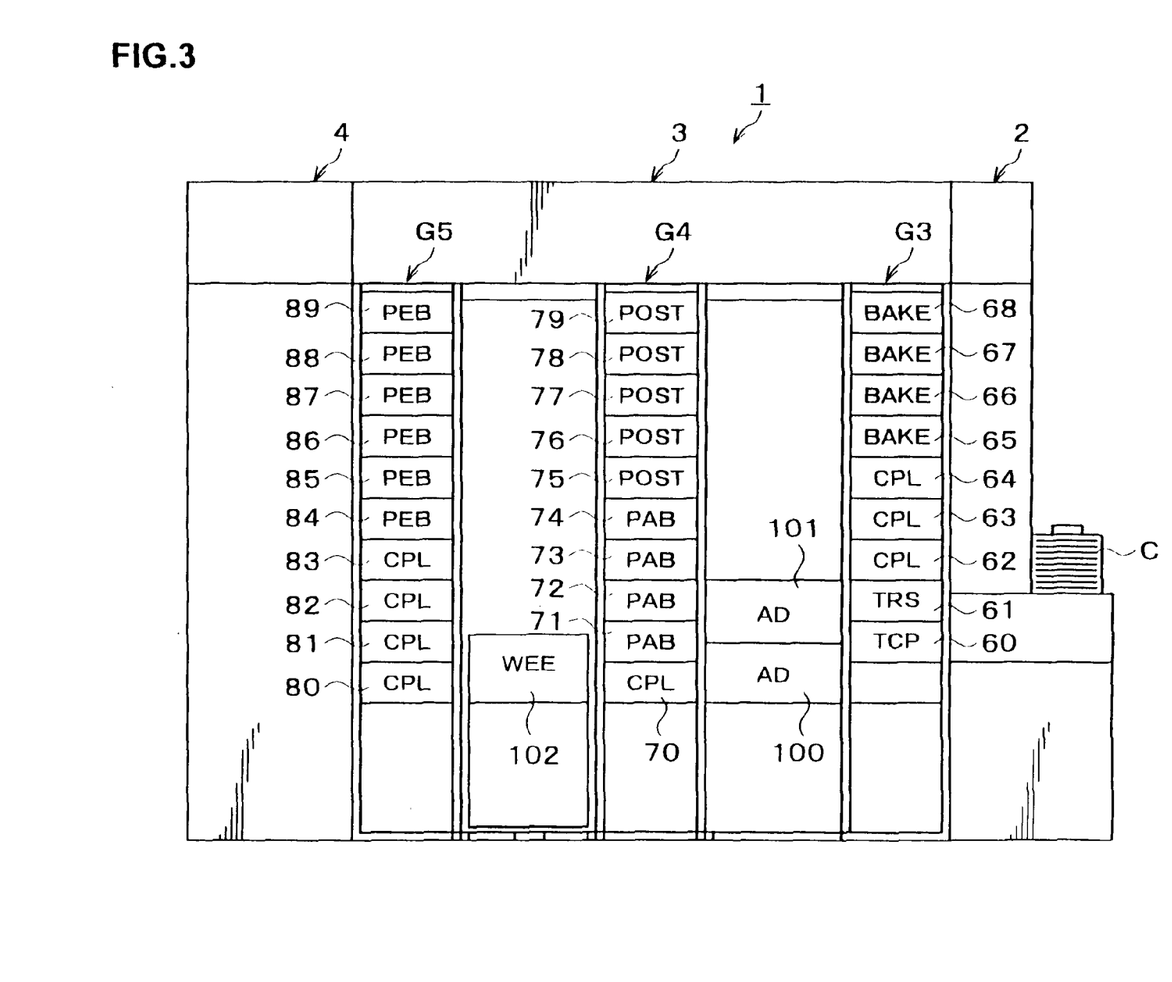
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 incorporating a temperature setting apparatus for a thermal processing plate according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, each for performing predetermined processing or treatment in a manner of single wafer processing in the photolithography process; and an interface station 4 for delivering the wafers W to/from a not-shown aligner provided adjacent to the processing station 3, are integrally connected together.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer arrangement direction of the wafers W housed in the cassette C (a Z-direction; the vertical direction), and thus can selectively access the wafers W in each of the cassettes C arranged in the X-direction.

The wafer transfer body 7 is rotatable in a θ-direction around a Z-axis, and can access a temperature regulating unit 60 and a transition unit 61 included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side.

Between the third processing unit group G3 and the fourth processing unit group G4, a first transfer unit 10 is provided. The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light during exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under a high precision temperature control, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for thermally processing the wafer W, for example, high-precision temperature regulating units 80 to 83, and post-exposure baking units (hereinafter, referred to as "PEB units") 84 to 89 each for heat-processing the wafer W after exposure and before development, are ten-tiered in order from the bottom.

Figure 4:
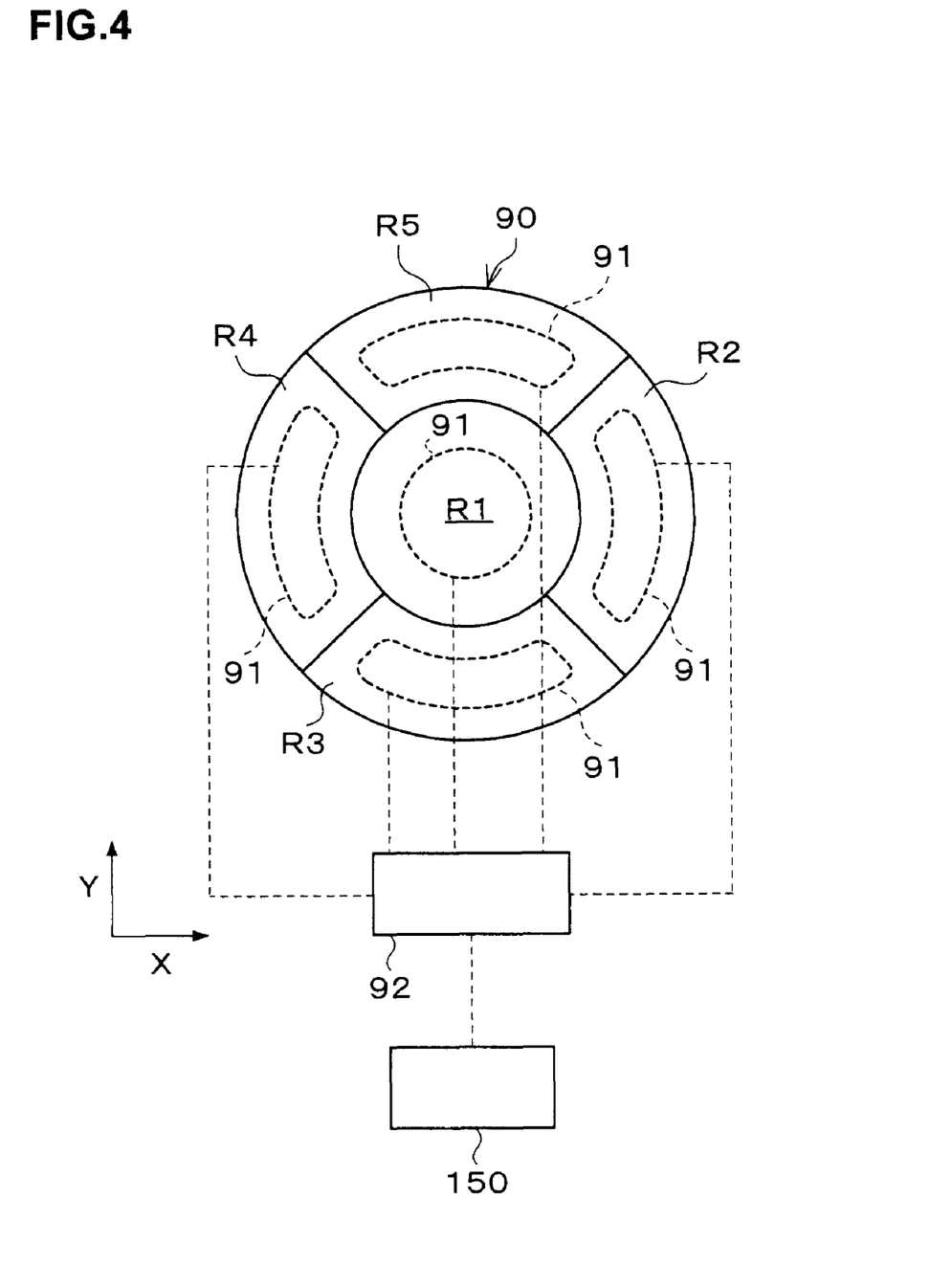
FIG. 4 is a plan view showing a configuration of a thermal plate in a PEB unit.

The PEB units 84 to 89 each include, for example, a thermal plate 90, as shown in FIG. 4, as a thermal processing plate for mounting and heating the wafer W thereon. The thermal plate 90 has an almost disk shape with a large thickness. The thermal plate 90 is divided into a plurality of, for example, five thermal plate regions $R_1$, $R_2$, $R_3$, $R_4$ and $R_5$. The thermal plate 90 is divided, for example, into the circular thermal plate region $R_1$ which is located at the central portion as seen in plan view and the thermal plate regions $R_2$ to $R_5$ which are made by equally dividing the peripheral portion around the thermal plate region $R_1$ into four sectors.

A heater 91 generating heat by power feeding is individually embedded in each of the thermal plate regions $R_1$ to $R_5$ of the thermal plate 90 and can heat each of the thermal plate regions $R_1$ to $R_5$. The heating value of each of the heaters 91 of the thermal plate regions $R_1$ to $R_5$ is adjusted, for example, by a temperature controller 92. The temperature controller 92 can adjust the heating value of the heater 91 to control the temperature of each of the thermal plate regions $R_1$ to $R_5$ to a predetermined set temperature. The temperature setting in the temperature controller 92 is performed, for example, by a later-described temperature setting apparatus 150.

As shown in FIG. 1, on the positive direction side in the X-direction to the first transfer unit 10, a plurality of processing and treatment units are arranged, for example, adhesion units 100 and 101 each for performing hydrophobic treatment on the wafer W being two-tiered in order from the bottom as shown in FIG. 3. As shown in FIG. 1, on the positive side in the X-direction to the second transfer unit 11, for example, an edge exposure unit 102 is disposed which selectively exposes only the edge portion of the wafer W to light.

In the interface station 4, for example, a wafer transfer body 111 moving on a transfer path 110 extending in the X-direction and a buffer cassette 112 are provided as shown in FIG. 1. The wafer transfer body 111 is movable in the vertical direction and also rotatable in the θ-direction, and thus can access the not-shown aligner adjacent to the interface station 4, the buffer cassette 112, and the fifth processing unit group G5 and transfer the wafer W to them.

In the coating and developing treatment system 1 configured as described above, for example, a series of wafer processing in the photolithography process as follows is performed. The unprocessed wafers W are first taken out by the wafer transfer body 7 one by one from the cassette C on the cassette mounting table 5, and successively transferred to the temperature regulating unit 60 in the third processing unit group G3. The wafer W transferred to the temperature regulating unit 60 is temperature-regulated to a predetermined temperature, and is then transferred by the first transfer unit 10 to the bottom coating unit 23, where an anti-reflection film is formed. The wafer W having the anti-reflection film formed thereon is transferred by the first transfer unit 10 to the high-temperature thermal processing unit 65 and the high-precision temperature regulating unit 70 in sequence so that predetermined processing is performed in each of the units.

Thereafter, the wafer W is transferred to the resist coating unit 20, where a resist film is formed on the wafer W. The wafer W is then transferred by the first transfer unit 10 to the pre-baking unit 71 and subjected to pre-baking. The wafer W is subsequently transferred by the second transfer unit 11 to the edge exposure unit 102 and the high-precision temperature regulating unit 83 in sequence so that the wafer W is subjected to predetermined processing in each of the units. The wafer W is then transferred by the wafer transfer body 111 in the interface station 4 to the not-shown aligner, where the wafer W is exposed to light. The wafer W for which exposure processing has been finished is transferred by the wafer transfer body 111, for example, to the PEB unit 84.

In the PEB unit 84, the wafer W is mounted on the thermal plate 90 which has been set to a predetermined temperature for each of the thermal plate regions $R_1$ to $R_5$ in advance to thereby be subjected to post-exposure baking.

The wafer W for which the post-exposure baking has been completed is transferred by the second transfer unit 11 to the high-precision temperature regulating unit 81, where the wafer W is temperature-regulated. The wafer W is then transferred to the developing treatment unit 30, where the resist film on the wafer W is developed. The wafer W is then transferred by the second transfer unit 11 to the post-baking unit 75, where the wafer W is subjected to post-baking. The wafer W is then transferred to the high-precision temperature regulating unit 63, where the wafer W is temperature-regulated. The wafer W is then transferred by the first transfer unit 10 to the transition unit 61 and returned to the cassette C by the wafer transfer body 7, thus completing the photolithography process being a series of wafer processing.

Figure 5:
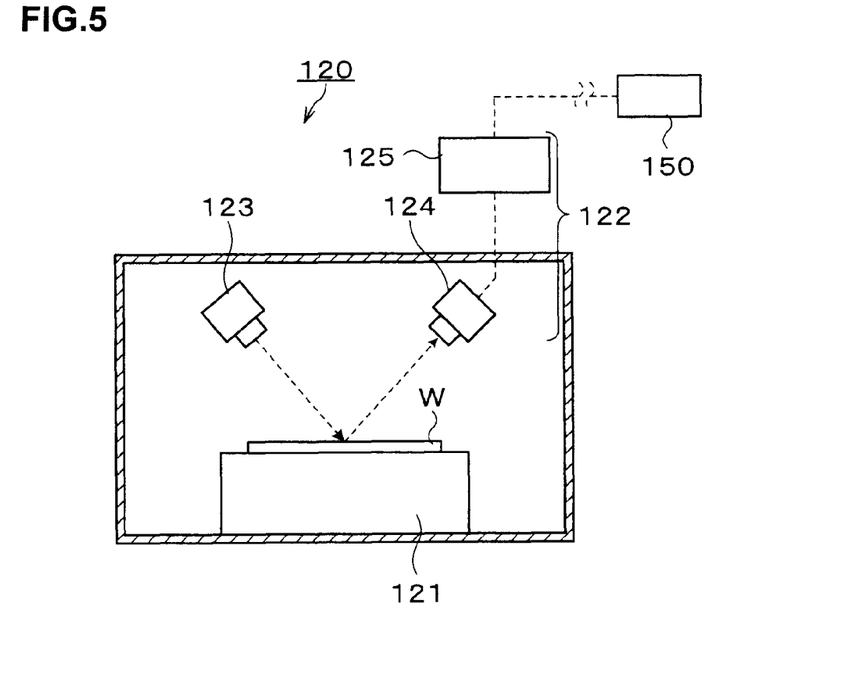
FIG. 5 is an explanatory view showing the outline of a configuration of a line width measuring unit.

Incidentally, a line width measuring unit 120 for measuring the line width of a resist pattern as the processing state within the wafer is provided as shown in FIG. 1 in the above-described coating and developing treatment system 1. The line width measuring unit 120 is provided, for example, in the cassette station 2. The line width measuring unit 120 includes, for example, a mounting table 121 for horizontally mounting the wafer W thereon as shown in FIG. 5 and an optical profilometer 122. The mounting table 121 forms, for example, an X-Y stage and can move in two dimensional directions in the horizontal directions.

The optical profilometer 122 includes, for example, a light irradiation unit 123 for applying light to the wafer W from an oblique direction, a light detection unit 124 for detecting the light applied from the light irradiation unit 123 and reflected by the wafer W, and a calculation unit 125 for calculating the line width of the resist pattern on the wafer W based on light reception information from the light detection unit 124. The line width measuring unit 120 according to this embodiment is for measuring the line width of the resist pattern, for example, using the Scatterometry method, in which the line width of the resist pattern can be measured in the calculation unit 125 by checking the light intensity distribution within the wafer detected by the light detection unit 124 against a virtual light intensity distribution stored in advance and obtaining a line width of the resist pattern corresponding to the checked virtual light intensity distribution.

The line width measuring unit 120 can measure the line widths at a plurality of locations within the wafer by horizontally moving the wafer W relative to the light irradiation unit 123 and the light detection unit 124. The measurement result of the line width measuring unit 120 can be outputted, for example, from the calculation unit 125 to a later-described temperature setting apparatus 150.

Next, the configuration of the temperature setting apparatus 150 for performing temperature setting of the thermal plate 90 in the above-described PEB units 84 to 89 will be described. The temperature setting apparatus 150 is composed of, for example, a general-purpose computer comprising a CPU and a memory. The temperature setting apparatus 150 is connected to the temperature controller 92 for the thermal plate 90 and the line width measuring unit 120 as shown in FIG. 4 and FIG. 5.

Figure 6:
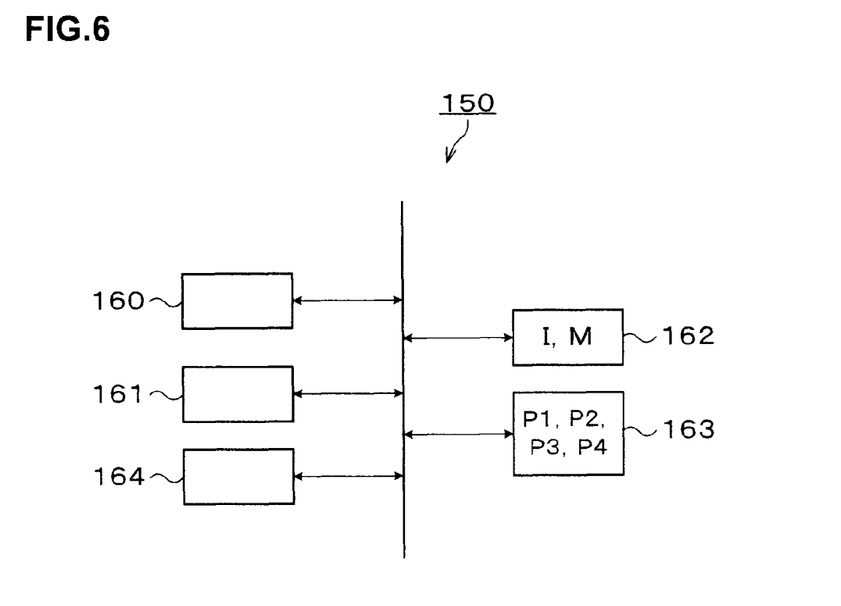
FIG. 6 is a block diagram showing a configuration of a temperature setting apparatus.

The temperature setting apparatus 150 comprises, for example, as shown in FIG. 6, a computing unit 160 for executing various kinds of programs; an input unit 161 for inputting, for example, various kinds of information for temperature setting of the thermal plate 90; a data storage unit 162 for storing the various kinds of information for temperature setting of the thermal plate 90; a program storage unit 163 for storing the various kinds of programs for temperature setting of the thermal plate 90; and a communication unit 164 for communicating the various kinds of information for temperature setting of the thermal plate 90 to/from the temperature controller 92 and the line width measuring unit 120.

Figure 7:
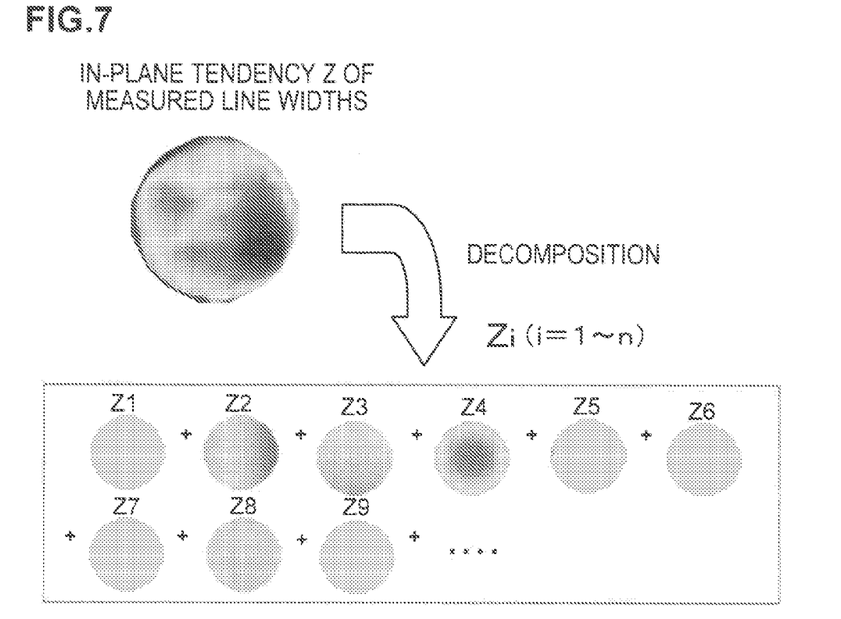
FIG. 7 is an explanatory view showing a state in which the in-plane tendency of line widths by the line width measurements is decomposed into a plurality of in-plane tendency components using a Zernike polynomial.

The program storage unit 163 stores, for example, a program P1 to calculate, from measurement results of the line widths within the wafer, a plurality of in-plane tendency components $Z_i$ (where i=1 to n, and n is an integer equal to or greater than 1) of the measured line widths within the wafer. The plurality of in-plane tendency components $Z_i$ are expressed by decomposing an in-plane tendency Z (the variation tendency within the wafer) of the measured line widths within the wafer into a plurality of components using a Zernike polynomial as shown in FIG. 7.

Adding here explanation about the Zernike polynomial, the Zernike polynomial is a complex function on a unit circle with a radius of 1 (practically used as a real function) which is often used in the optical field, and has arguments (r, θ) of polar coordinates. The Zernike polynomial is mainly used to analyze the aberration component of a lens in the optical field, and the wavefront aberration is decomposed using the Zernike polynomial, whereby aberration components based on the shape of each independent wavefront, for example, a mount shape, a saddle shape, or the like can be known.

In this embodiment, the line width measured values at many points within the wafer are expressed in the height direction above the wafer surface and the points of the line width measured values are connected by a smooth curved surface so that the in-plane tendency Z of the measured line widths within the wafer is grasped as a vertically waiving wavefront. The in-plane tendency Z of the measured line widths within the wafer is then decomposed using the Zernike polynomial, for example, into a plurality of in-plane tendency components $Z_i$, such as a deviation component in the Z-direction being the vertical direction, a gradient component in the X-direction, a gradient component in the Y-direction, and a curvature component convexly curving or concavely curving. The magnitude of each of the in-plane tendency components $Z_i$ can be expressed by the Zernike coefficient.

The Zernike coefficient indicating each of the in-plane tendency components $Z_i$ can be specifically expressed by the following expressions using the arguments (r, θ) of polar coordinates.

Z1 (1)
Z2 (r·cos θ)
Z3 (r·sin θ)
Z4 ($2r^2-1$)
Z5 ($r^2$·cos 2θ)
Z6 ($r^2$·sin 2θ)
Z7 (($3r^3-2r$)·cos θ)
Z8 (($3r^3-2r$)·sin θ)
Z9 ($6r^4-6r^2+1$)
and so on.

The Zernike coefficient Z1 indicates the line width average value within the wafer (the deviation component in the Z-direction), the Zernike coefficient Z2 indicates the gradient component in the X-direction, the Zernike coefficient Z3 indicates the gradient component in the Y-direction, and the Zernike coefficients Z4, Z9 indicate the curvature components, for example, in this embodiment.

As shown in FIG. 6, the data storage unit 162 stores, for example, Zernike coefficient number information I on in-plane tendency components $Za_i$ (where i is an integer between 1 and n) improvable (variable) by changing, for example, the temperature correction values for the thermal plate regions $R_1$ to $R_5$ of the in-plane tendency components $Z_i$ decomposed from the in-plane tendency Z of the measured line widths within the wafer. For example, for the identification of the improvable in-plane tendency components $Za_i$, the temperatures of the respective thermal plate regions $R_1$ to $R_5$ of the thermal plate 90 are individually varied and the line widths within the wafer in that case are measured. The in-plane tendency of the measured line widths in that case is then decomposed using the Zernike polynomial and in-plane tendency components which vary depending on the variations in the set temperatures of the thermal plate regions $R_1$ to $R_5$ are regarded as the improvable in-plane tendency components $Za_i$.

Figure 8:
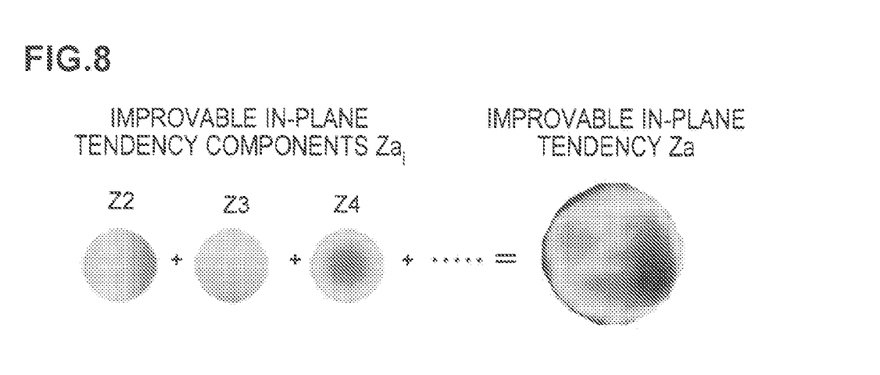
FIG. 8 is an explanatory view showing contents to calculate an improvable in-plane tendency by adding up improvable in-plane tendency components.

The program storage unit 163 stores, as shown in FIG. 8, for example, a program P2 to calculate an improvable in-plane tendency Za in the measured line widths within the wafer by identifying the improvable in-plane tendency components $Za_i$ of the in-plane tendency components $Z_i$ decomposed from the in-plane tendency Z of the measured line widths within the wafer and adding up them. The program storage unit 163 further stores a program P3 to judge whether or not 3σ (sigma) indicating the magnitude (the degree of variation) of the calculated improvable in-plane tendency Za exceeds a threshold value which has been determined in advance.

The program storage unit 163 stores a program P4 to calculate a temperature correction value ΔT for each of the thermal plate regions $R_1$ to $R_5$ to bring each of the in-plane tendency components $Za_i$ of the improvable in-plane tendency Za to 0 (ZERO), for example, from the following relational expression (1).

$$\Delta Z = M \cdot \Delta T \quad (1)$$

Figure 9:
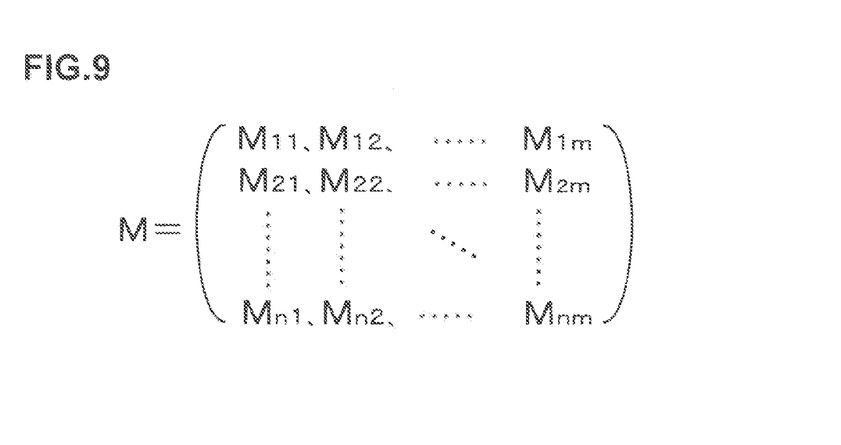
FIG. 9 is a determinant showing an example of a calculation model.

The calculation model M of the relational expression (1) is a correlation matrix indicating the correlation between the variation amount (the change amount of each Zernike coefficient) ΔZ of each in-plane tendency component $Z_i$ of the line widths within the wafer and the temperature correction value ΔT. Specifically, the calculation model M is a determinant of n (the number of in-plane tendency components) rows by m (the number of thermal plate regions) columns expressed using the Zernike coefficients on a specific condition, for example, as shown in FIG. 9.

The calculation model M is made by raising the temperature of each of the thermal plate regions $R_1$ to $R_5$ in sequence by 1° C., measuring the line width variation amounts within the wafer in each case, calculating the variation amounts of the Zernike coefficients (the variation amounts of the in-plane tendency components) corresponding to the variation amounts of the line widths, and expressing the variation amounts of the Zernike coefficients per unit temperature variation as elements $M_{i,j}$ of the determinant ($1 \leq i \leq n$, and $1 \leq j \leq m$, m=5 being the number of thermal plate regions in this embodiment). Note that the in-plane tendency component that does not vary even when the temperature of the thermal plate region is raised by 1° C. creates a variation amount of the Zernike coefficient of 0 (ZERO), so that the element corresponding to that is 0 (ZERO).

The relational expression (1) is expressed by the following expression (2) by multiplying both sides of the relational expression (1) by an inverse matrix $M^{-1}$ of the calculation model M.

$$\Delta T = M^{-1} \cdot \Delta Z \quad (2)$$

To bring each of the in-plane tendency components $Za_i$ of the improvable in-plane tendency Za to 0 (ZERO), a value obtained by multiplying the value of each of the improvable in-plane tendency components $Za_i$ by −1 is substituted into the variation amount ΔZ of the in-plane tendency, and 0 (ZERO) is substituted into the other unimprovable in-plane tendency components.

Note that the various kinds of programs for embodying the temperature setting process by the temperature setting apparatus 150 may be ones recorded on a recording medium such as a computer-readable CD and installed from the recording medium into the temperature setting apparatus 150.

Figure 10:
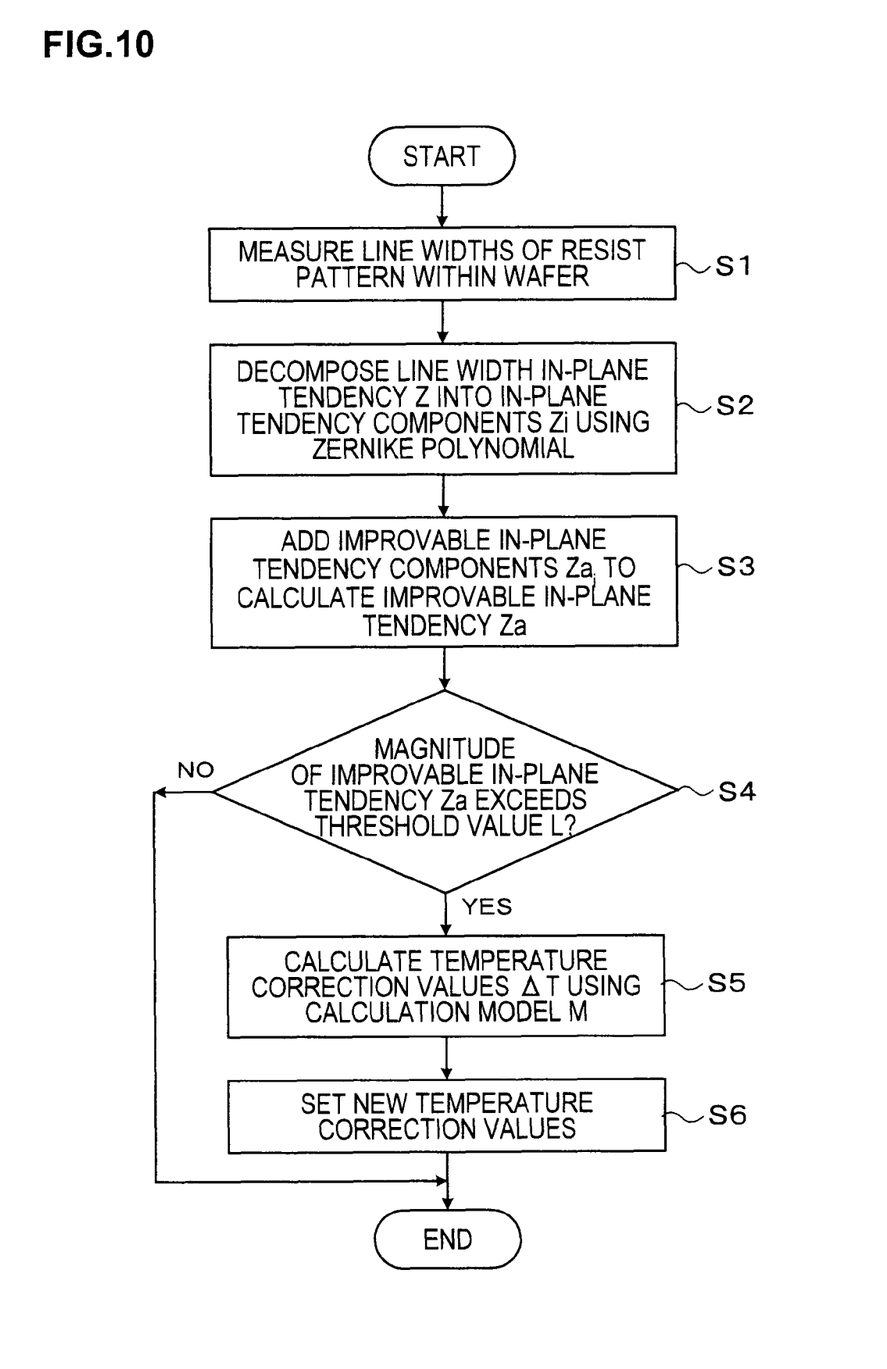
FIG. 10 is a flowchart showing a temperature setting process.

Next, the temperature setting process by the temperature setting apparatus 150 configured as described above will be described. FIG. 10 is a flowchart showing one example of the temperature setting process.

Figure 11:
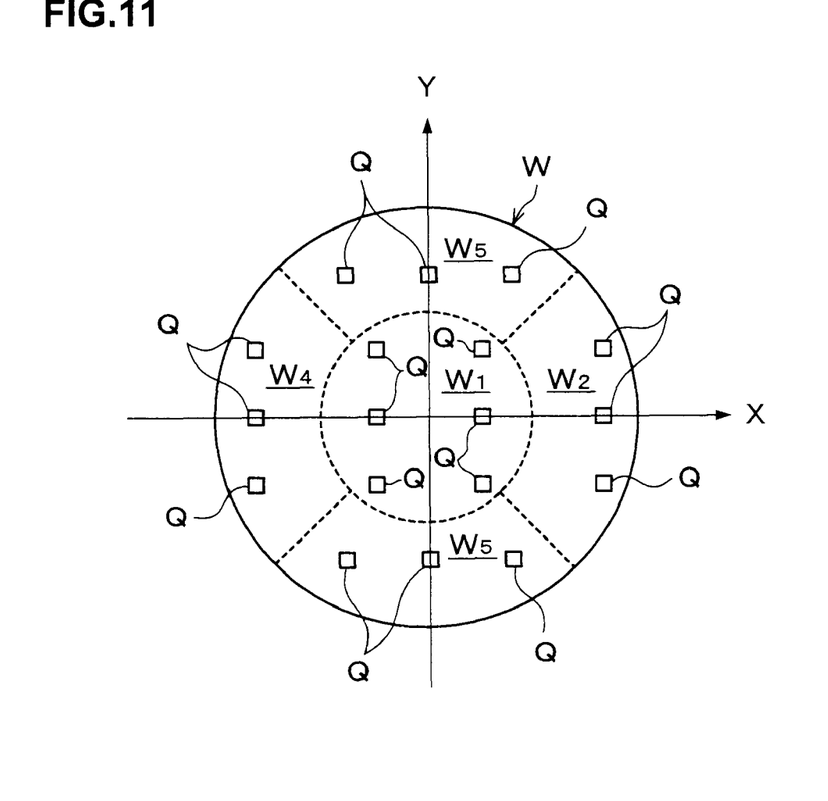
FIG. 11 is an explanatory view showing measurement points of the line widths within the wafer.

For example, every several wafers W which are being successively processed in the coating and developing treatment system 1 are periodically subjected to line width measurement. The wafer W for which the above-described series of photolithography processing has been finished, for example, is transferred into the line width measuring unit 120 in the cassette station 2, where the line widths of the resist pattern within the wafer W are measured (Step S1 in FIG. 10). In this event, the line widths at a plurality of measurement points Q within the wafer as shown in FIG. 11 are measured to measure at least the line widths in wafer regions $W_1$, $W_2$, $W_3$, $W_4$, and $W_5$ corresponding to the respective thermal plate regions $R_1$ to $R_5$ of the thermal plate 90.

The measurement results of the line widths within the wafer are outputted to the temperature setting apparatus 150. In the temperature setting apparatus 150, for example, from measured values of the line widths at the plurality of measurement points Q in the wafer regions $W_1$ to $W_5$, the in-plane tendency Z of the measured line widths within the wafer is calculated, and the in-plane tendency Z is decomposed to calculate the plurality of in-plane tendency components $Z_i$ (i=1 to n) using the Zernike polynomial as shown in FIG. 7 (Step S2 in FIG. 10).

Subsequently, the improvable in-plane tendency components $Za_i$ obtained in advance are extracted from the plurality of in-plane tendency components $Z_i$ as shown in FIG. 8 and added together. Thus, the improvable in-plane tendency Za of the line widths within the wafer is calculated (Step S3 in FIG. 10).

Then, 3σ (sigma) indicating the magnitude of the improvable in-plane tendency Za is calculated and whether nor not the value of 3σ exceeds a threshold value L which has been set in advance is judged (Step S4 in FIG. 10).

Figure 12:
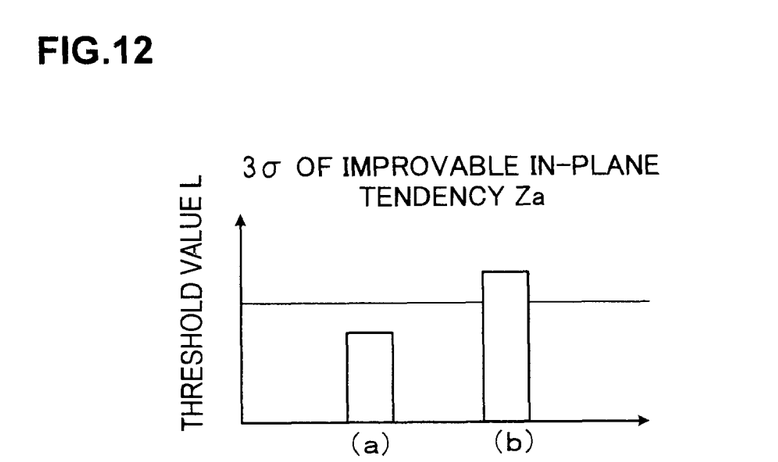
FIG. 12 is a graph showing a case when 3σ of the improvable in-plane tendency exceeds a threshold value and a case when it does not exceed.

When 3σ of the improvable in-plane tendency Za is equal to or smaller than the threshold value L as (a) shown in FIG. 12, the change of the temperature correction values ΔT for the thermal plate regions $R_1$ to $R_5$ is not performed, and the temperature setting process for the wafer W ends.

Figure 13:
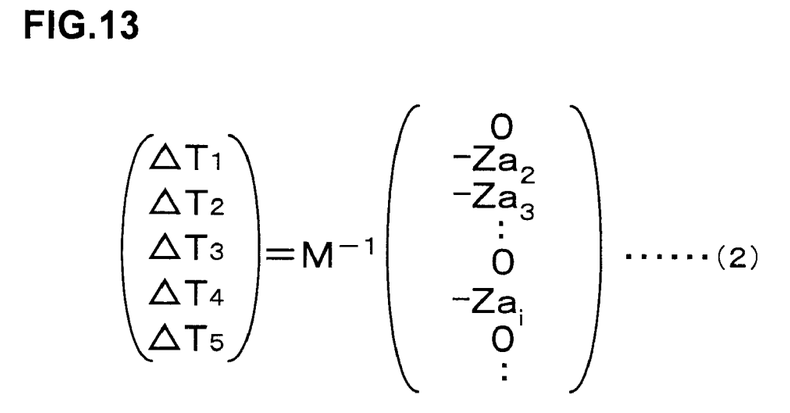
FIG. 13 is a relational expression of the calculation model into which the adjustment amounts for the in-plane tendency components and temperature correction values are substituted.

For example, when 3σ of the improvable in-plane tendency Za exceeds the threshold value L as (b) shown in FIG. 12, the temperature correction values ΔT for the thermal plate regions $R_1$ to $R_5$ of the thermal plate 90 are changed. For example, a value obtained by multiplying each of the in-plane tendency components $Za_i$ of the improvable in-plane tendency Za by −1 is substituted into the term of ΔZ of the relational expression (2) as shown in FIG. 13. For the unimprovable in-plane tendency component, 0 (ZERO) is substituted. This relational expression (2) is used to find the temperature correction values $\Delta T_1$, $\Delta T_2$, $\Delta T_3$, $\Delta T_4$, and $\Delta T_5$ for the thermal plate regions $R_1$ to $R_5$ to bring the components $Za_i$ of the improvable in-plane tendency Za to 0 (ZERO) (Step S5 in FIG. 10).

Thereafter, the information on each of the temperature correction values $\Delta T_1$ to $\Delta T_5$ is outputted from the communication unit 164 to the temperature controller 92, and new temperature correction values $\Delta T_1$ to $\Delta T_5$ are set for the temperature settings of the thermal plate regions $R_1$ to $R_5$ of the thermal plate 90 in the temperature controller 92 (Step S6 in FIG. 10). After the new temperature correction values are set, the temperature setting process for the wafer W ends. The above-described temperature setting process is periodically and repeatedly performed.

Note that the above-described temperature setting process is performed, for example, by executing the above-described various kinds of programs stored in the temperature setting apparatus 150.

According to the above embodiment, the measurement of the line widths within the wafer is performed, the improvable in-plane tendency Za is calculated from the in-plane tendency Z of the measured line widths, and whether or not 3σ indicating the magnitude of the improvable in-plane tendency Za exceeds the threshold value L which has been set in advance is judged, so that when it exceeds, the temperature correction values ΔT for the thermal plate regions $R_1$ to $R_5$ of the thermal plate 90 are changed. In this case, since the change of the temperature correction values ΔT is performed based on the magnitude of the improvable in-plane tendency Za calculated from the line width measurement within the wafer and on the threshold value L, the timing to change the settings of the temperature correction values $\Delta T$ can be stabilized irrespective of, for example, the experience and knowledge of an operator. Further, since the change of the temperature correction values $\Delta T$ is performed only when the improvable in-plane tendency Za is large, the temperature correction values $\Delta T$ are not changed in an unnecessary case, thus making it possible to make the timing to change the settings of the temperature correction values $\Delta T$ appropriate.

According to the above embodiment, in calculating the improvable in-plane tendency Za, the in-plane tendency Z of the measured line widths within the wafer is decomposed into the plurality of in-plane tendency components $Z_i$ using the Zernike polynomial, and the improvable in-plane tendency components $Za_i$ of the plurality of in-plane tendency components $Z_i$ are added together to calculate the improvable in-plane tendency Za, whereby the calculation of the improvable in-plane tendency Za is accurately and easily performed.

Further, since, when changing the temperature correction values $\Delta T$ for the thermal plate regions $R_1$ to $R_5$, the calculation model M of the relational expression (1) is used to calculate the temperature correction values $\Delta T_1$ to $\Delta T_5$ for the thermal plate regions $R_1$ to $R_5$ to bring each of the improvable in-plane tendency components $Za_i$ to 0 (ZERO) and the calculated temperature correction values $\Delta T_1$ to $\Delta T_5$ are set for the temperatures of the thermal plate regions $R_1$ to $R_5$, an optimal line width in-plane tendency improved as much as possible can be obtained in the wafer processing after temperature correction. Accordingly, a uniform line width within the wafer can be formed. Particularly, since the thermal processing performed in the PEB unit 84 greatly affects the line width of the finally formed resist pattern by the photolithography process, the effect by performing the temperature setting of the thermal plate 90 of the PEB unit 84 by the method is profound.

Though the calculation of the improvable in-plane tendency Za and the calculation of the temperature correction values $\Delta T$ for the thermal plate regions $R_1$ to $R_5$ are performed using the Zernike polynomial, they may be performed using other methods.

Figure 14:
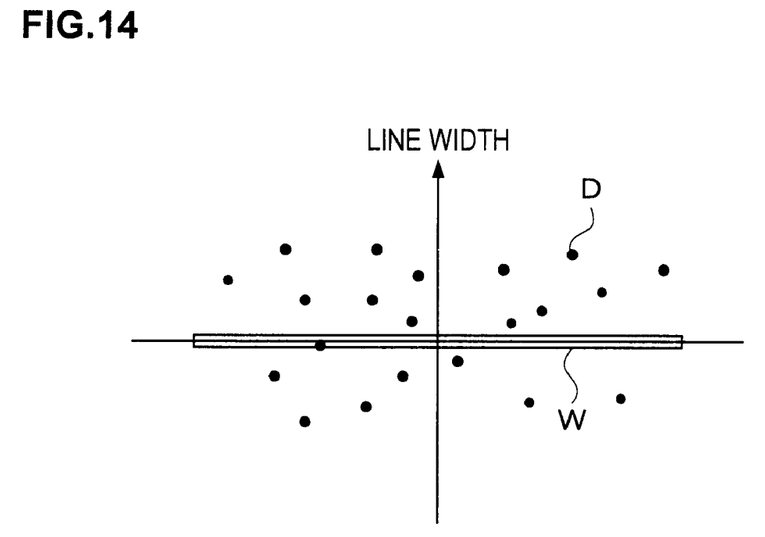
FIG. 14 is an explanatory view showing a variation tendency of line width measured values.
Figure 15:
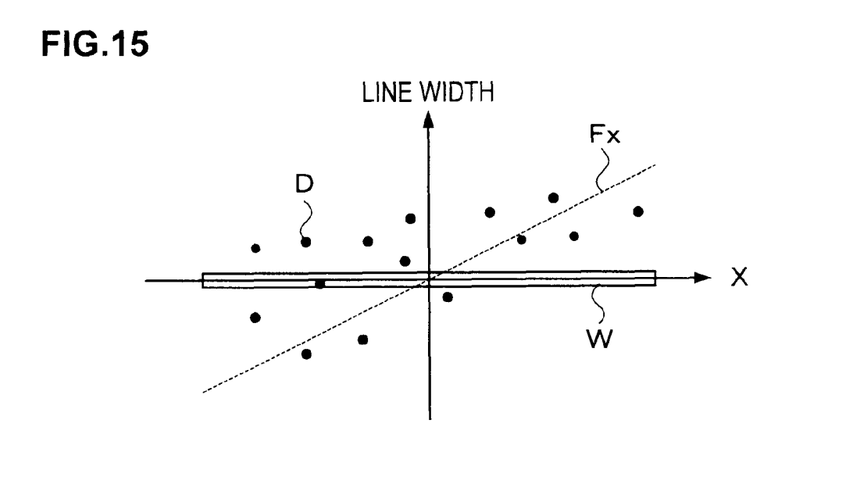
FIG. 15 is an explanatory view showing a gradient component in an X-direction of the variation tendency of the line width measured values.
Figure 16:
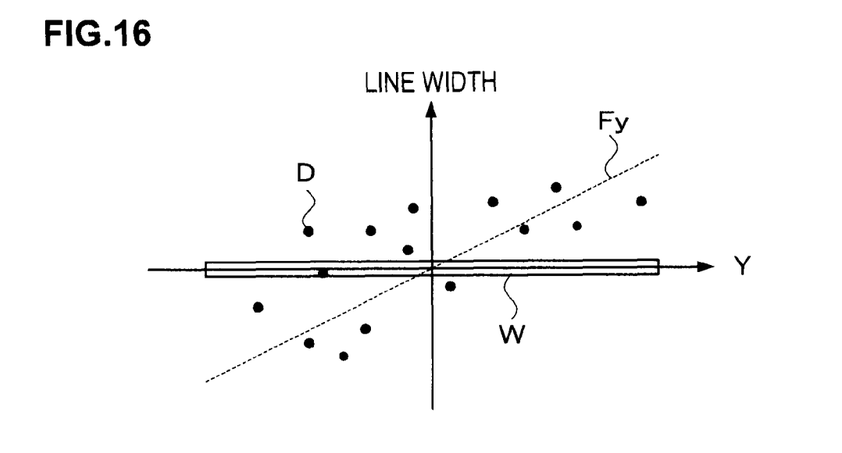
FIG. 16 is an explanatory view showing a gradient component in a Y-direction of the variation tendency of the line width measured values.
Figure 17:
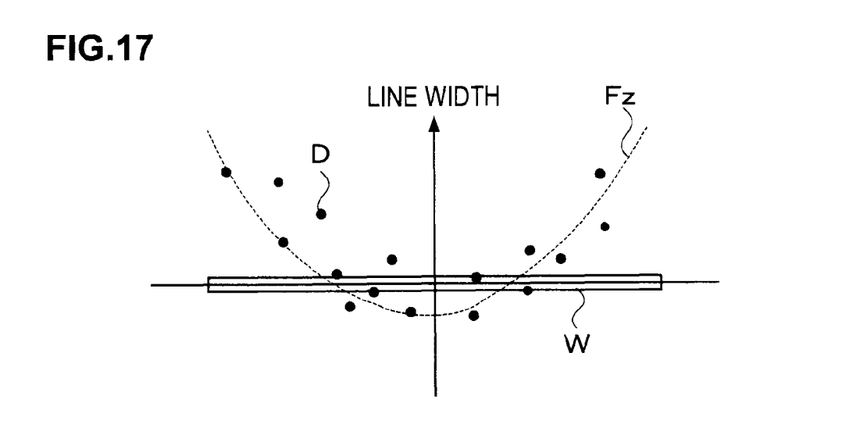
FIG. 17 is an explanatory view showing a curvature component of the variation tendency of the line width measured values.

The in-plane tendency of the measured line widths within the wafer is indicated by expressing line width measured values D at the plurality of measurement points Q within the wafer in the height direction above the wafer surface, for example, as shown in FIG. 14. The line width measured values D at the plurality of measurement points Q are projected to a vertical plane including an X-axis, for example, as shown in FIG. 15, and a gradient component Fx in the X-direction being one of the in-plane tendency components is calculated from the distribution of the line width measured values D using the least square method. The line width measured values D at the plurality of measurement points Q are projected to a vertical plane including a Y-axis as shown in FIG. 16, and a gradient component Fy in the Y-direction being one of the in-plane tendency components is calculated from the distribution of the line width measured values D using the least square method. Furthermore, a convex curvature component Fz being one of the in-plane tendency components is calculated as shown in FIG. 17 by subtracting the gradient component Fx in the X-direction and the gradient component Fy in the Y-direction from the whole in-plane tendency of the line width measured values D. For example, these in-plane tendency components Fx, Fy, and Fz are added together to calculate an improvable in-plane tendency Fa. The temperature correction values $\Delta T$ for the thermal plate regions $R_1$ to $R_5$ are changed only when the magnitude of the improvable in-plane tendency Fa exceeds the threshold value L which has been set in advance.

When changing the temperature correction values $\Delta T$ for the thermal plate regions $R_1$ to $R_5$, the temperature correction values $\Delta T$ for the thermal plate regions $R_1$ to $R_5$ are calculated to bring each of the in-plane tendency components Fx, Fy, and Fz to 0 (ZERO) of the improvable in-plane tendency Fa, for example, by the following relational expression (3).

$$\Delta F = M \cdot \Delta T \qquad (3)$$

The calculation model M of the relational expression (3) is a correlation matrix indicating the correlation between the variation amount $\Delta F$ of each of the in-plane tendency components Fx, Fy, and Fz of the line widths within the wafer and the temperature correction values $\Delta T$.

A value obtained by multiplying the value of each of the tendency components Fx, Fy, and Fz by $-1$ is substituted into the term of $\Delta F$ of the relational expression (3) to calculate the temperature correction values $\Delta T_1$ to $\Delta T_5$ for the thermal plate regions $R_1$ to $R_5$. Thereafter, new temperature correction values $\Delta T_1$ to $\Delta T_5$ are set for the temperature settings of the thermal plate regions $R_1$ to $R_5$.

Since the temperature correction values $\Delta T$ are changed based on the magnitude of the improvable in-plane tendency Fa and on the threshold value L which has been set in advance according also to this example, it becomes possible to make the timing to change the settings of the temperature correction values $\Delta T$ stabilized and appropriate irrespective of, for example, the experience and knowledge of an operator.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention.

While the magnitude of the improvable in-plane tendency Za is expressed by $3\sigma$ and compared to its threshold value L in the above embodiment, the magnitude of the improvable in-plane tendency Za may be expressed by a difference between the maximum value and the minimum value within the wafer and the difference may be compared to its threshold value.

In the above embodiment, an alarm may be issued when the magnitude of the improvable in-plane tendency Za exceeds its threshold value L. In this case, a display unit may be provided in the temperature setting apparatus 150 of the coating and developing treatment system 1 so that the alarm may be displayed on the display unit.

While the thermal plate 90 to be temperature-set is divided into five regions in the above embodiment, any number of divisions can be selected. The shapes of the divided regions of the thermal plate 90 can also be arbitrarily selected. While the above embodiment is an example in which the temperature setting of the thermal plate 90 of the PEB unit 84 is performed based on the line widths within the wafer, the present invention is also applicable to a case of performing the temperature setting of a thermal plate for performing other thermal processing placed in a pre-baking unit, a post-baking unit or the like and the temperature setting of a cooling plate of a cooling unit for cooling the wafer W.

Further, while the temperature setting of the thermal plate is performed based on the line widths within the wafer in the above embodiment, the temperature setting of a thermal processing plate of a PEB unit, a pre-baking unit or a post-baking unit based on the processing state other than the line width within the wafer, such as the angle of the side wall in the groove of the resist pattern (the side wall angle) or the film thickness of the resist pattern.

Further, while the temperature setting of the thermal plate is performed based on the line width of a pattern after the photolithography process and before the etching process in the above embodiment, the temperature setting of the thermal processing plate may be performed based on the line width or the side wall angle of the pattern after the etching process. Furthermore, the present invention is also applicable to temperature setting of a thermal processing plate for thermally processing substrates other than the wafer, such as an FPD (Flat Panel Display), a mask reticle for a photomask, and the like.

The present invention is useful in performing the temperature setting of a thermal processing plate for mounting and thermally processing a substrate thereon.

What is claimed is:

1. A temperature setting method of a thermal processing plate when mounting and thermally processing a substrate thereon, the thermal processing plate being divided into a plurality of regions, a temperature being settable for each of the regions, and a temperature correction value for adjusting an in-plane temperature being settable for each of the regions, said method comprising the steps of:
   measuring line widths of a resist pattern within the substrate for the substrate which has been subjected to a series of substrate processing including the thermal processing;
   calculating, from an in-plane tendency of the substrate of the measured line widths, an in-plane tendency improvable by changing the temperature correction value for each of the regions of the thermal processing plate, the in-plane tendency being a line width of the resist pattern at a plurality of points in a thickness direction within the substrate; and
   changing the temperature correction value for each of the regions of the thermal processing plate when a magnitude of the improvable in-plane tendency exceeds a threshold value set in advance.

2. The temperature setting method of a thermal processing plate as set forth in claim 1,
   wherein when the magnitude of the improvable in-plane tendency exceeds the threshold value, an alarm is issued.

3. The temperature setting method of a thermal processing plate as set forth in claim 1,
   wherein in calculating the improvable in-plane tendency,
   the in-plane tendency of the substrate of the measured line widths is decomposed to a plurality of in-plane tendency components using a Zernike polynomial, and in-plane tendency components improvable by changing the temperature correction value for each of the regions of the thermal processing plate of the plurality of in-plane tendency components are added to calculate the improvable in-plane tendency.

4. The temperature setting method of a thermal processing plate as set forth in claim 3,
   wherein in changing the temperature correction value for each of the regions of the thermal processing plate,
   the temperature correction value for each of the regions of the thermal processing plate to bring each of the improvable in-plane tendency components to 0 (ZERO) is calculated using a calculation model indicating a correlation between change amounts of the in-plane tendency components and the temperature correction values, and the calculated temperature correction value is set for the temperature of each of the regions of the thermal processing plate.

5. The temperature setting method of a thermal processing plate as set forth in claim 1,
   wherein the series of substrate processing is processing of forming a resist pattern on the substrate in a photolithography process.

6. The temperature setting method of a thermal processing plate as set forth in claim 5,
   wherein the thermal processing is heating processing performed after exposure processing and before developing treatment.

7. A non-transitory computer-readable recording medium recording a computer program thereon for controlling a temperature setting method of a thermal processing plate when mounting and thermally processing a substrate thereon, the thermal processing plate being divided into a plurality of regions, a temperature being settable for each of the regions, and a temperature correction value for adjusting an in-plane temperature being settable for each of the regions,
   said temperature method comprising the steps of:
   measuring line widths of a resist pattern within the substrate for the substrate which has been subjected to a series of substrate processing including the thermal processing;
   calculating, from an in-plane tendency of the substrate of the measured line widths, an in-plane tendency improvable by changing the temperature correction value for each of the regions of the thermal processing plate, the in-plane tendency being a line width of the resist pattern at a plurality of points in a thickness direction within the substrate; and
   changing the temperature correction value for each of the regions of the thermal processing plate when a magnitude of the improvable in-plane tendency exceeds a threshold value set in advance.

8. A temperature setting apparatus for setting a temperature of a thermal processing plate when mounting and thermally processing a substrate thereon, the thermal processing plate being divided into a plurality of regions, a temperature being settable for each of the regions, and a temperature correction value for adjusting an in-plane temperature being settable for each of the regions,
   said temperature setting apparatus including a computing unit for performing the following processes of:
   calculating an in-plane tendency improvable by changing the temperature correction value for each of the regions of the thermal processing plate from an in-plane tendency of the substrate of processing states based on measured line widths of a resist pattern within the substrate for the substrate which has been subjected to a series of substrate processing including the thermal processing, the in-plane tendency being a line width of the resist pattern at a plurality of points in a thickness direction within the substrate; and
   changing the temperature correction value for each of the regions of the thermal processing plate when a magnitude of the improvable in-plane tendency exceeds a threshold value set in advance.

9. The temperature setting apparatus for a thermal processing plate as set forth in claim 8,
   wherein when the magnitude of the improvable in-plane tendency exceeds the threshold value, an alarm is issued.

10. The temperature setting apparatus for a thermal processing plate as set forth in claim 8,
   wherein in calculating the improvable in-plane tendency, the in-plane tendency of the substrate of the measured line widths is decomposed to a plurality of in-plane tendency components using a Zernike polynomial, and in-plane tendency components improvable by changing the temperature correction value for each of the regions of the thermal processing plate of the plurality of in-plane tendency components are added to calculate the improvable in-plane tendency.

11. The temperature setting apparatus for a thermal processing plate as set forth in claim 10,
wherein in changing the temperature correction value for each of the regions of the thermal processing plate,
the temperature correction value for each of the regions of the thermal processing plate to bring each of the improvable in-plane tendency components to 0 (ZERO) is calculated using a calculation model indicating a correlation between change amounts of the in-plane tendency components and the temperature correction values, and the calculated temperature correction value is set for the temperature of each of the regions of the thermal processing plate.

12. The temperature setting apparatus for a thermal processing plate as set forth in claim 8,
wherein the series of substrate processing is processing of forming a resist pattern on the substrate in a photolithography process.

13. The temperature setting apparatus for a thermal processing plate as set forth in claim 12,
wherein the thermal processing is heating processing performed after exposure processing and before developing treatment.

* * * * *